US009235797B2

(12) United States Patent
Filpi et al.

(10) Patent No.: US 9,235,797 B2
(45) Date of Patent: Jan. 12, 2016

(54) ENHANCED IC CARD

(71) Applicant: STMICROELECTRONICS S.r.l., Agrate Brianza (IT)

(72) Inventors: Giuliano Filpi, Parco Emini-Caserta (IT); Antonio Sismundo, Naples (IT); Raffaele Caiazzo, Casoria (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 0 days.

(21) Appl. No.: 14/665,323

(22) Filed: Mar. 23, 2015

(65) Prior Publication Data
US 2015/0286920 A1 Oct. 8, 2015

(30) Foreign Application Priority Data

Apr. 2, 2014 (IT) .................................. MI14A0584

(51) Int. Cl.
*G06K 19/077* (2006.01)
*H01L 21/56* (2006.01)

(52) U.S. Cl.
CPC ...... *G06K 19/07739* (2013.01); *G06K 19/0772* (2013.01); *H01L 21/56* (2013.01)

(58) Field of Classification Search
CPC .................... G06K 19/07749; G06K 19/0775; G06K 19/07766; G06K 19/07767
USPC .......................................... 235/492, 487, 489
See application file for complete search history.

(56) References Cited

U.S. PATENT DOCUMENTS

| 6,826,691 | B1 * | 11/2004 | Stout | G06F 21/6245 380/29 |
| 2008/0290178 | A1 | 11/2008 | Reynolds et al. | |
| 2013/0072068 | A1 * | 3/2013 | Holmes | G06K 19/07739 439/638 |
| 2014/0342777 | A1 * | 11/2014 | Cao | H04W 8/183 455/558 |
| 2014/0367473 | A1 * | 12/2014 | Ottobon | G06K 19/077 235/488 |

FOREIGN PATENT DOCUMENTS

| DE | 102012001776 A1 | 8/2013 |
| FR | 2982981 A1 | 5/2013 |
| WO | 2013098518 A1 | 7/2013 |

OTHER PUBLICATIONS

Business Wire, "Oberthur Technologies Makes Mobile Users' Lives Easier with Its MultiSIM, The First SIM Card Combining Classic SIM, Micro-SIM and Nano-IM Plug-Ins," Nov. 8, 2013, pp. 1-3.

* cited by examiner

*Primary Examiner* — Daniel St Cyr
(74) *Attorney, Agent, or Firm* — Allen, Dyer, Doppelt, Milbrath & Gilchrist, P.A.

(57) ABSTRACT

An IC card may include a substrate having opposing first and second surfaces, and a circuit carried by the substrate adjacent the first surface of the substrate. The substrate may include a first area defining a first sector of the substrate carrying the circuit and configured to be separated from the IC card, the first sector having a form and size based upon a first IC card format, the first area having a first line delimiting the first sector to the first IC card format. The substrate may include a second area defining a second sector around the first sector and configured to be separated from the IC card based upon a second line. The second sector may have a form and size based upon at least one of a second IC card format and a third IC card format.

28 Claims, 3 Drawing Sheets

FIG. 4
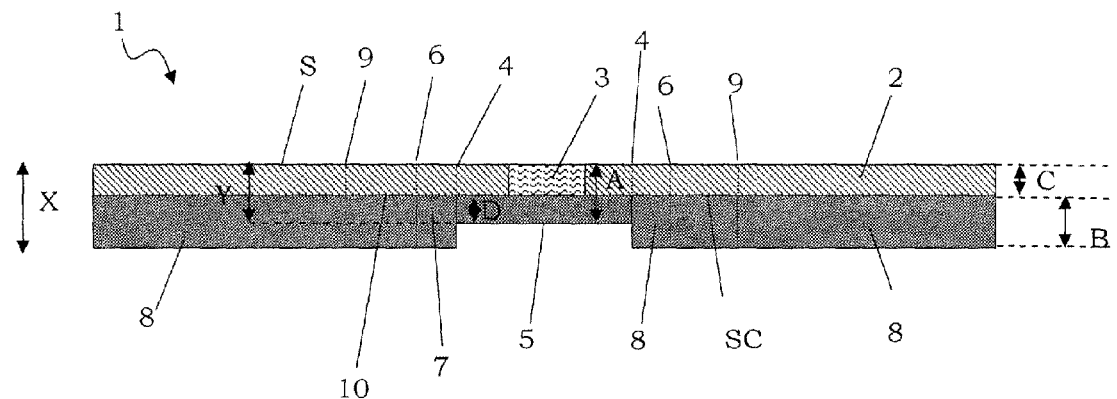
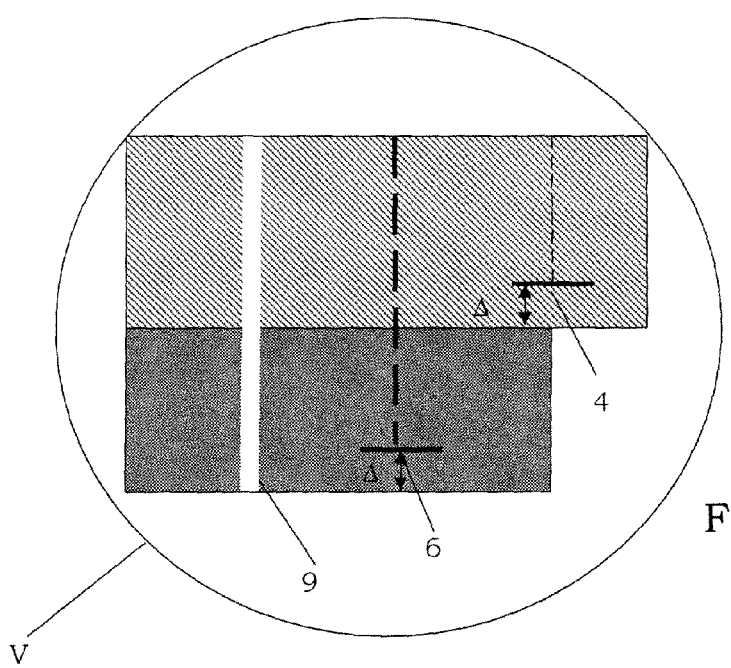
FIG. 5

ENHANCED IC CARD

TECHNICAL FIELD

The present disclosure relates to an integrated circuit card having a substrate, and a related method of making an integrated circuit card.

BACKGROUND

Integrated circuit (IC) cards typically include a substrate and a circuit formed in the substrate. The substrate 20 with the predefined full-size (1FF) IC card format is shown in FIG. 1, and the circuit 3 may be used as a card for certain applications, which comply with the standard ISO/IEC 7810:2003, for example, as a credit card or cash point card. For other applications, the circuit is detached from the card, together with a sector of predefined form and size, for example, the predefined form and size equivalent to the Mini-SIM (2FF), Micro-SIM (3FF) or Nano-SIM (4FF) IC card formats (FIG. 1).

Essentially, the IC in the sector forms a small-size card which may be used for specific applications. For example, in the 2FF format (ISO/IEC 7810:2003 specification), the card may be used with most cellular phones. In the 3FF format (ETSI TS 102 221 V9.0.0 specification), it may be used with certain smart phones, such as the iPhone 4; and in the 4FF format (ETSI TS 102 221 V11.0.0 specification), it may be used in the more recent iPhone 5. The formats differ in terms of surface dimensions and/or thickness.

The substrate with the 1FF format has a size of 85.6 mm×53.98 mm×0.76 mm and has, formed in it, a number of pre-incisions corresponding to the sector with 2FF format (25 mm×15 mm×0.76 mm), the sector with 3FF format (15 mm×12 mm×0.76 mm) or the sector with 4FF format (12.3 mm×8.8 mm×0.67 mm), for removal of the sectors. Such cards may be helpful because they incorporate four different formats, i.e. 1FF, 2FF, 3FF and 4FF.

However, they may have several drawbacks, mainly associated with the production complexity and costs and certain defects, which occur when removing the sectors with 2FF, 3FF or 4FF format from the card. In particular, as can be understood from the dimensions indicated above, the 4FF format is characterized not only by a smaller surface area compared to other formats, but also by a smaller thickness, which may require machining of the substrate.

A first technique includes starting with a substrate having a thickness, which is substantially the same as the thickness of the formats 1FF, 2FF and 3FF (0.76 mm), and scraping a portion of the substrate in which the thinner sector (0.67 mm), with format 4FF thickness, is formed for integration of the circuit. After scraping, the pre-cut lines are formed in the substrate to delimit the 2FF, 3FF and 4FF sectors.

In this method, it may be difficult to perform a precise scraping operation, involving precisely only the 4FF sector. Moreover, incision of the pre-cut lines may be complicated by the different thickness of the substrate. Moreover, performing pre-cut lines before scraping may result in breakage of the lines during scraping.

This technique may give rise to a large number of defective cards during production, or to defects in the final product, resulting in difficult extraction of the sectors with 2FF, 3FF and 4FF format. This may be problematic in the case where a sector, for example, 4FF format sector, becomes detached, even only partially from the card, despite the fact that the user intends to detach another sector, for example, a sector with 3FF or 2FF format.

Another technique may include injection-molding, namely the injection of a material in a mold that already defines the thinner portion of the 4FF sector. However, this technique is even more costly, owing to the molding process, and does not solve the aforementioned problems associated with the pre-cut lines.

SUMMARY

An IC card may include a substrate having opposing first and second surfaces, and a circuit carried by the substrate adjacent the first surface of the substrate. The substrate may include a first area defining a first sector of the substrate carrying the circuit and configured to be separated from the IC card. The first sector may have a form and size based upon a first IC card format, and the first area may have a first line delimiting the first sector to the first IC card format. The substrate may include a second area defining a second sector around the first sector and configured to be separated from the IC card based upon a second line. The second sector may have a form and size based upon at least one of a second IC card format and a third IC card format. The IC card may include a coating on the second surface of the substrate and being aligned with the second area, the coating having, along the second sector, a thickness equal to a difference between a thickness of the at least one of the second IC card format and the third IC card format and a thickness of the first sector.

BRIEF DESCRIPTION OF THE DRAWINGS

FIG. 4 is a cross-sectional view of the card of FIG. 2, according to another embodiment of the present disclosure.

FIG. 5 is an enlarged view of FIG. 2.

DETAILED DESCRIPTION

Figure 1:
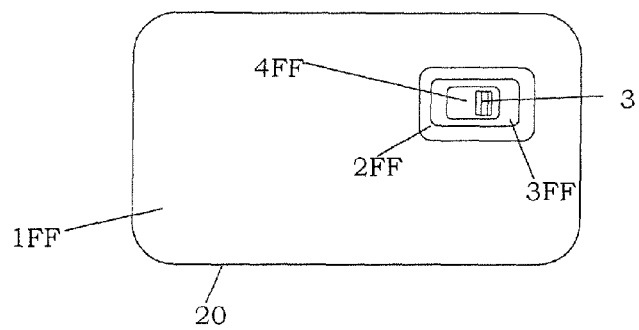
FIG. 1 is a top plan view of an IC card, according to the prior art.

The idea forming the basis of the present disclosure is that of producing an IC card from a substrate with a thickness smaller than or, preferably, the same as the thickness of the 4FF format of IC cards, and increasing the thickness along surface portions of the substrate intended to the form the 2FF or 3FF format sectors. In particular, according to this approach, the substrate is formed with a thickness (smaller than) or the same as the thickness of the 4FF format (namely the minimum thickness from among all the required formats), its thickness being then increased only subsequently, by means of a screen-printing coating process, which avoids damage to or weakening of the card structure.

Essentially, the screen-printed coating comprises a layer with a predefined thickness of screen-printing ink which adheres immediately to the surface of the substrate situated opposite the surface along which the contacts of the circuit are exposed. The substrate is, for example, made of plastic. This screen-printing process also offers the advantage of allowing integration of an image in the layer of ink designed to thicken the substrate along the 2FF or 3FF sections.

According to the proposed approach mentioned above, the technical problem may be addressed by an IC card comprising a substrate and a circuit integrated in the substrate with the pads of the circuit which are substantially coplanar with a surface of the substrate, characterized in that the substrate comprises a first area defining a first sector of the substrate comprising the circuit and able to be separated from the card. The first sector has a form and size equivalent to a 4FF format of IC cards and being intended to be separated from the card by means of the formation of a first pre-cut or weakening line delimiting the first sector with 4FF format. The card further comprises at least one second area defining a second sector around the first sector and able to be separated from the card owing to the formation of a second pre-cut or weakening line, the second sector having a form and size equivalent to a 2FF or 3FF format of IC cards; and a screen-printed coating on the surface SC opposite to the surface S of the substrate, in the region of at least the second sector, where the screen-printed coating, along the second sector, has a thickness (B) which is equal to a difference between a predefined thickness X of the 2FF or 3FF format and a thickness (A) of the first sector.

Advantageously, the production of the card may be simplified and optimized, because it is not required to perform a structural operation on the substrate, involving either molding or thinning; on the other hand, the structure of the substrate remains unchanged and the substrate is coated with screen-printing ink. Advantageously, the screen-printed coating avoids any damage to the structure of the substrate or to the pre-cuts defined therein.

According to one embodiment, the thickness (A) of the first sector is equal to a thickness (C) of the substrate or a predefined thickness (Y) of the 4FF format of IC cards. In this case, the screen-printed coating is not applied to the sector with 4FF format, achieving an acceleration in the process and savings in terms of screen-printing ink.

According to another embodiment, the thickness (C) of the substrate is smaller than a predefined thickness (Y) of the 4FF format of IC cards, and the screen-printed coating also lines the opposite surface of the substrate along the first sector, with a thickness (D) equal to the difference between the predefined thickness (Y) of the 4FF format and the thickness (C) of the substrate, thus providing the first sector with a thickness (A) equal to the predefined thickness (Y) for the 4FF format of IC cards. Advantageously, in this embodiment, it is possible to print also an image in the opposite surface of the substrate associated with the 4FF format sector.

According to another embodiment, the card may comprise a third area defining a third sector around the second sector, where the second sector has a form and size equivalent to the 3FF format of IC cards and the third sector has a form and size equivalent to the 2FF format of IC cards. The third sector is intended to be separated from the card with the aid of a shearing die, the screen-printed coating being applied along at least the second sector and the third sector.

Advantageously, according to this aspect, the card is much more versatile, because it incorporates several formats, but it is also more reliable than the cards according to the prior art, because the application of the screen-printed coating improves the removability of the sectors and avoids damage to the pre-incisions, especially in the 3FF and 4FF sectors which are situated very close to each other. For the user, it is much simpler to detach the sector with the desired format containing the integrated circuit. Moreover, according to the embodiments described above, the percentage of reject cards resulting from manufacturing defects is reduced significantly.

According to another embodiment, the substrate has a predefined form and size equivalent to the 1FF format of IC cards. Advantageously, according to this embodiment, the circuit may be used in the substrate, i.e. without being removed from the card, for certain applications, for example, as a credit card. It is quite possible for the card to have a different format, incorporating the sectors having a 2FF and/or 3FF and/or 4FF format.

According to another aspect, the screen-printed coating is applied over the whole of the opposite surface SC of the substrate. According to another variant, the screen-printed coating is applied over the whole of the opposite surface SC of the substrate, except along the first sector. Advantageously, according to these aspects, the entire opposite surface may be used to print information by means of the method which determines the formation of the 2FF and/or 3FF sectors of the card. Additionally, the first pre-cut line relating to the first sector with 4FF format and/or the second pre-cut line relating to the second sector with 3FF format are formed only in the substrate.

Also, the first pre-cut line and/or the second pre-cut line may be formed in only a predetermined thickness of the substrate. Essentially, the lines are formed so that no light is able to pass through the card. Advantageously, a thickness of the substrate, preferably towards the opposite surface, joins the sectors together or to the substrate, consolidating the structure of the card and helping prevent accidental separation of the sector from the card.

According to an embodiment, the first pre-cut line and the second pre-cut line are formed in both a predetermined thickness of the substrate and a predetermined thickness of the screen-printed coating. According to this variant, the pre-cut line in the screen-printed coating facilitates precise separation of the sectors also in the coating, preventing the formation of jagged edges in the coating.

According to another embodiment, the second pre-cut line corresponding to the second sector with 3FF format is characterized by a greater incision depth than the first pre-cut line corresponding to the first sector with 4FF format. More generally, the first pre-cut line and the second pre-cut line are defined so as to facilitate detachment of the 3FF format sector from the 4FF format sector. Operationally speaking, the user, who needs to use the card with 4FF format, detaches first the 3FF format sector from the card and then the 4FF format sector from the 3FF format sector. Advantageously, the stepwise separating operation described above allows the sector with the smallest format to be preserved and protected during use.

Similarly, the cutting line of the shearing die corresponding to the 2FF format sector is formed so as to facilitate detachment of this sector from the 3FF format sector, in particular so that it is required to apply a force for separation of this 2FF format sector from the 3FF format sector. More particularly, the cutting line passes through the whole of the supporting base of the card. Operationally speaking, the user, who needs to use the card with 4FF or 3FF format, detaches first the 2FF format sector from the card and then the 3FF format sector from the 2FF format sector and, finally, if necessary, the 4FF format sector from the 3FF format sector.

According to another aspect of the present disclosure, a method of manufacturing an IC card comprises the step of integrating a circuit integrated circuit in a substrate, with the pads of the circuit substantially coplanar with a surface S of the substrate. The method includes defining in the substrate at least one first area defining a first sector having a form and size equivalent to a 4FF format and a second area defining a second sector having a form and size equivalent to a 3FF or 2FF format around the first sector, these sectors being intended to be separated from the card. The method includes applying a screen-printed coating on the surface SC opposite to the surface S of the substrate, in the region of at least the second sector with a 3FF or 2FF format of IC cards, the screen-printed coating being applied, along the second sector, so as to form a thickness (B) which is equal to the difference between a predefined thickness (X) of the 2FF or 3FF format and a thickness (A) of the first sector with 4FF format.

The method includes forming a first pre-cut or weakening line in the substrate, delimiting the first sector with 4FF format of the substrate, comprising the circuit and designed to be separated from the card, and forming at least one second pre-cut or weakening line in the substrate, delimiting the second sector of the substrate with 3FF or 2FF format around the first sector with 4FF format, designed to be separated from the card. Furthermore, the method may also comprise forming a cutting line, which delimits a third sector around the second sector and has a form and size equivalent to a 2FF format of IC cards.

Further characteristic features and advantages of the IC card and its method of production according to the present disclosure will become clear from the description below, provided solely by way of an example with reference to the accompanying drawings.

Figure 2:
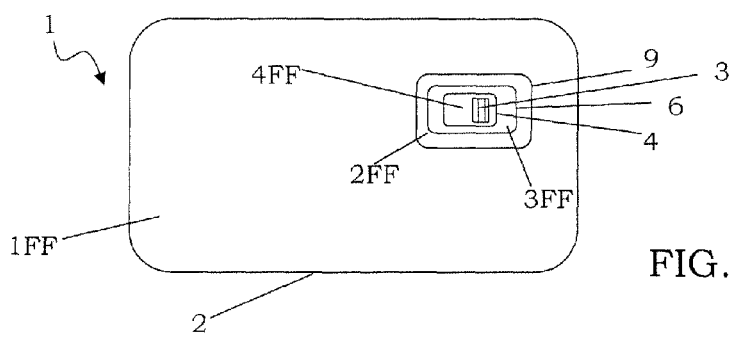
FIG. 2 is a top plan view of an IC card, according to the present disclosure.

The technical problem forming the basis of the present disclosure is that of devising a card with circuit integrated in a substrate from which the circuit may be simply removed together with a sector with 2FF, 3FF or 4FF format, therefore improving the card for the end user, but also simplifying and reducing the costs for production of the card, thus overcoming the limitations and drawbacks which are currently still associated with IC cards of the known type. With reference to FIG. 2, this shows an IC card 1 according to the present disclosure, comprising a substrate 2 and a circuit 3 integrated in the substrate. The substrate has a size and form equivalent to the format 1FF and the card may be used for example for applications of the banking type, e.g. as a credit card or cash point card.

The electric pads or contacts of the circuit 3, which are intended to come into contact with a reader, are substantially coplanar with a surface S of the substrate 2 and exposed on the card. A first area defines a first sector 5 of the substrate 2 comprising the circuit 3 delimited by a first pre-cut or weakening line 4.

The first sector 5 can be separated from the card 1. In particular, the first sector 5 has a form and size equivalent to a 4FF format of IC cards and can be used for specific applications, for example, in an iPhone 5. The surplus part of the substrate 2, once the first sector 5 has been detached, is not intended to be used subsequently.

At least one second area defines a second sector 7 in the substrate which comprises the first sector 5 and is delimited by a second pre-cut or weakening line 6. In other words, the second pre-cut lines 6 runs around the first sector 5. The second sector 7 can be separated from the card 1 and has a form and size equivalent to a 3FF format of IC cards.

A shearing die delimits a third area which defines a third sector 10 in the substrate, around the second sector 7 and delimited by a cutting line 9. In other words, the cutting line 10 runs around the second sector 7. This third sector 10 can therefore also be separated from the card 1 and has a form and size equivalent to a 2FF format of IC cards.

A screen-printed coating 8 on the surface SC, opposite to the surface S of the substrate 2 on which the circuit contacts are exposed, is applied along at least the second sector 7, thus increasing the thickness of the second sector 7 with respect to the first sector 5. In particular, the screen-printed coating 8, in the region of the second sector 7, has a thickness B equal to a difference between a predefined thickness X of the 2FF or 3FF format and a thickness A of the first sector 5. In other words, independently of the thickness of the substrate 2 and the first sector 5, the screen-printed coating 8 allows the thickness of the substrate 2 to be increased along the second sector 7, so that the second sector 7 has the thickness of the 1FF or 2FF or 3FF format, thus complying with the specifications of the respective standard.

Figure 3:
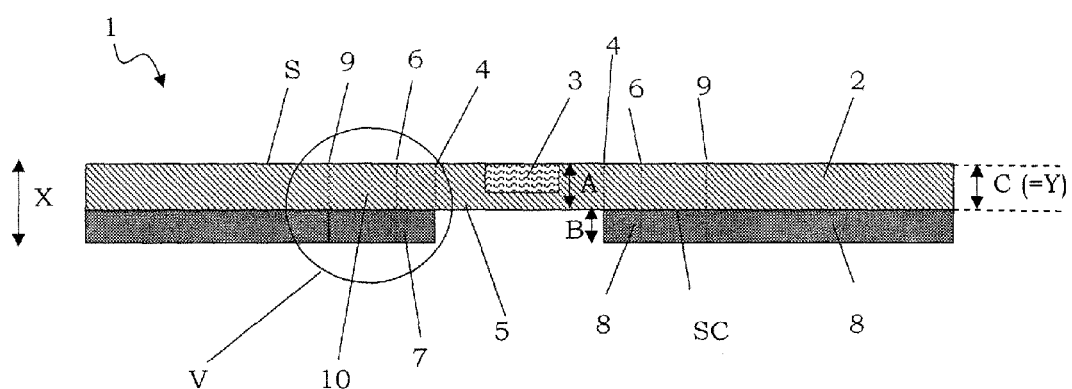
FIG. 3 is a cross-sectional view of the card of FIG. 2.

In FIG. 3, the thickness A of the first sector 5 is equal to a thickness C of the substrate 2 and to a predefined thickness Y of the 4FF format of IC cards, and the screen-printed coating 8 is not applied along the first sector 5. In FIG. 2, the screen-printed coating 8 is applied over the whole of the opposite surface SC of the substrate 2, except for the first sector 5, as mentioned. It is possible for the screen-printed coating 8 to be applied only to the second sector 7 and to the third sector 10, if the circuit is intended for applications in compliance with the 2FF or 3FF standard and not the 1FF standard.

In FIG. 4, which shows a variation of embodiment of the present disclosure, the thickness C of the substrate 2 is less than a predefined thickness Y of the 4FF format of IC cards. The screen-printed coating 8 also lines the opposite surface SC of the substrate 2 along the first sector 5, with a thickness D equal to the difference between the predefined thickness Y of the 4FF format and the thickness C of the substrate 2, providing the first sector 5 with a thickness A equal to the predefined thickness Y of the 4FF format of IC cards. In FIG. 3, the screen-printed coating 8 is applied over the whole of the opposite surface SC of the substrate, including the first sector 5. It is also envisioned to apply the screen-printed coating 8 only along the sectors 7, 10, in the respective thicknesses, if the circuit is intended for applications in compliance with the 2FF or 3FF or 4FF standard and not the 1FF standard. In this case, the peripheral part of the substrate 2, outside the third sector 10, is not coated.

As mentioned, the cutting line 9 delimits the third sector 10 around the second sector 7. In particular, the cutting line 9 runs around the second sector 7. Even more particularly, according to this embodiment of the disclosure, the second sector 7 has a form and size equivalent to the 3FF format of IC cards, and the third sector 10 has a form and size equivalent to the 2FF format of IC cards. The screen-printed coating 8 is applied along at least the second sector 7 and the third sector 10. Also, the first pre-cut line 4 and/or the second pre-cut line 6 may be formed only in the substrate 2; the cutting line 9 passes through the whole support, forming an aperture on either side of the card.

FIG. 5 shows the region of the cutting and pre-cut lines, according to an embodiment in which the first pre-cut line 4 and/or the second pre-cut line 6 are formed in only a predetermined thickness C1 of the substrate 2. In particular, in FIG. 5, the pre-cut line 4 stops before it reaches the opposite surface SC, the rest of the supporting base not being affected by the action of the pre-cut lines, thus determining in fact the force necessary for detachment of the associated first sector 5, while the second pre-cut line 6 passes through part of the surface SC, but not the screen-printed coating 8. In this case also, the rest of the support not affected by the action of the pre-cutting lines determines the force necessary for detachment. The cutting line 9 passes through the whole of the card, so that light may pass through it.

Figure 6:
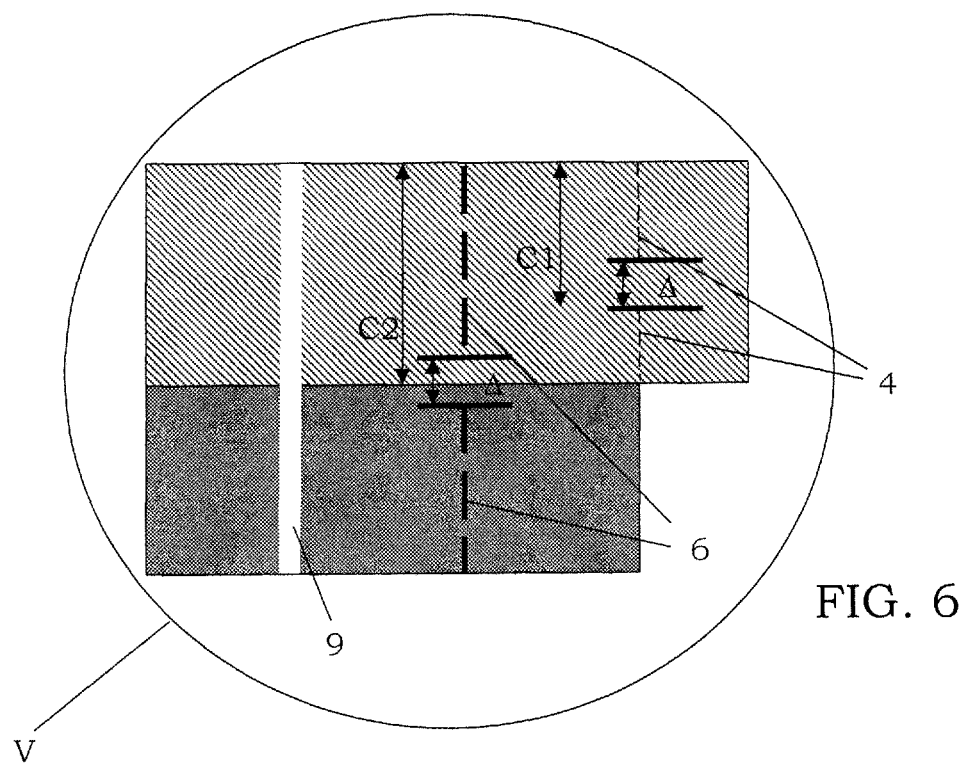
FIG. 6 is an enlarged view of FIG. 2, according to yet another embodiment.

FIG. 6 shows another embodiment in which the pre-cut line 6 is formed entering into the support on opposite sides thereof and stops in a zone of the surface of the surface SC, without the two opposite leading ends touching. In this case also, the rest of the support (indicated by A in the figure) not affected by the action of the pre-cut lines determines the force necessary for detaching the second sector with 3FF format. The first pre-cut line 4 is formed in an entirely equivalent manner, the rest of the support not affected by the action of the pre-cut lines being again indicated by A in the figure. The cutting line 9 passes instead through the whole of the card, allowing light to pass through.

FIGS. 5 and 6 show the different dimensions of the pre-cut lines. In particular, the second pre-cut line 6 is longer than the first pre-cut line 4 so as to prevent, following application of a force on the substrate 2 intended to separate the sectors from the card, separation of the first sector 5 from the substrate 2 occurring before separation of the second sector 7 from the substrate. The first sector 5 is separated together with the circuit 3 from the second sector 7, only after the second sector 7, comprising the first sector 5 and the circuit 3, is separated from the card 1.

Similarly, the cutting line 9 is formed to prevent, following application of a force on the substrate 2 which separates the sectors from the card, separation of the second sector 7 from the substrate 2 occurring before separation of the third sector 10 from the substrate 2. The second sector 7 is separated together with the circuit 3 from the third sector 10, only after the third sector 10, comprising the second sector 7 and the circuit 3, is separated from the card 1. Only at this point, the first sector 5 may be separated together with the circuit 3 from the second sector 7, namely after the second sector 7, comprising the first sector 5 and the circuit 3, has been separated from the third sector 10.

The method of manufacturing the card 1 comprises a preliminary step of providing a substrate 2, for example, made of plastic, and integrating a circuit 3 in the substrate 2, with the pads of the circuit 3 substantially coplanar with a surface S of the substrate 2. With reference to FIG. 2, the steps of the method are described, the method further includes: defining in the substrate 2 at least the first area defining the first sector having a form and size equivalent to a 4FF format and the second area defining the second sector having a form and size equivalent to a 3FF or 2FF format around the first sector, these sectors being intended to be separated from the card 1. The method includes applying the screen-printed coating 8 on the surface SC opposite to the surface S of the substrate 2, in the region of at least the second sector with 3FF or 2FF format of IC cards, the screen-printed coating 8 being applied, along the second sector 7, so as to form a thickness B which is equal to a difference between a predefined thickness X of the 2FF or 3FF format and a thickness A of the first sector 5 with 4FF format. The method includes forming a first pre-cut or weakening line 4 in the substrate 2, in order to delimit the first sector 5 with 4FF format of the substrate 2 comprising the circuit 3 and designed to be separated from the card, and forming at least one second pre-cut or weakening line 6, in order to delimit the second sector 7 of the substrate 1 with 3FF or 2FF format around the first sector 5 with 4FF format, therefore also comprising the circuit 3 and designed to be separated from the card 1.

Furthermore, the method may also comprise forming a cutting line 9 which delimits the third sector 10 around the second sector 7 and has a form and size equivalent to a 2FF format of IC cards. Definition of the cutting lines and pre-cut lines may be performed before or after application of the screen-printed coating. Preferably, the screen-printing coating step is performed first and then the card is subjected to a mechanical process in order to define the cutting lines and pre-cut lines corresponding to the 2FF, 3FF and 4FF formats.

Also, the cutting line 9 may comprise a structure with three attachment points, having calibrated dimensions at the points. The three-point structure corresponds substantially to a channel all the way around the third sector 10, except for the 3 points. With such a cutting line 9, the third sector 10 in the 2FF format is the first sector, which is detached from the card 1 when a force is applied onto the substrate 2.

The pre-cut lines 6 and 4 of the sections 7 and 5 are formed by way of the penetration into the substrate 2 of cutting edges at an angle of about 15°-25° with respect to the surface S of the substrate. Essentially, no light is able to pass through from one side to the other of the card 1, even following the formation of the pre-cut lines. Additionally, the penetration of the cutting edges may be calibrated both on the top side (surface S) and on the bottom side (surface SC) of the substrate 2 and may be calibrated so as to terminate at a middle line of the substrate.

In view of the consistency of the screen-printing ink, and in particular the flexibility of the corresponding coating, after separation of a sector from the substrate 2 or after separation of a sector comprising the circuit from a sector on the outside thereof, the screen-printed coating situated on the substrate or on the outer sector (i.e. that not comprising the integrated circuit) is deformed, by an amount at least sufficient to prevent reuse of the frame (substrate or sector) as an adaptor.

The screen-printed coating 8 is applied in such a way that the thickness of the first sector 5 (4FF) complies with the standard ETSI TS 102 221 V 11.0.0 and the thickness of the sectors 10 and 7 complies with the standards ETSI TS 102 221 V 11.0.0 and ISO/IEC 7810:2003. All the formats comply with the standards ISO/IEC 7816-1 and ISO/IEC 7816-2.

In particular, the coating application step is performed by compressing the screen-printing ink on the substrate through a mesh, preferably made of fabric, and, by means of a doctor blade, applied with a predetermined pressure on the mesh. Application of the screen-printed coating fully replaces the lamination steps performed according to the prior art, thereby avoiding the complex treatment of the plastic mixtures by means of heating and cooling, and application thereof in layers, in order to define the sectors.

The advantages of the card and the method according to the present disclosure may be numerous: production of the card is simplified and optimized because the screen-printing coating step using ink replaces the structural operations performed on the substrate (molding, thinning). The screen-printed coating prevents damage to the structure of the substrate or the pre-incisions formed therein and allows graphical processing of the card to be performed prior to structural formation of the 2FF, 3FF and, if appropriate, 4FF sectors. Moreover, it is possible to print an image also in the opposite surface of the substrate associated with the 4FF format sector.

The card is more reliable than the known cards because application of the screen-printed coating improves the removability of the sectors, especially in the case of the 3FF and 4FF sectors which are situated very close to each other. In view of the particular form of the pre-cut lines, a thickness of the substrate, preferably towards the opposite surface, joins the sectors together or to the substrate, consolidating the structure of the card and preventing accidental separation of the sectors from the card.

That which is claimed is:
1. An integrated circuit (IC) card comprising:
a substrate having opposing first and second surfaces;
a circuit carried by said substrate and having a plurality of bond pads being coplanar with the first surface of said substrate;
said substrate comprising
a first area defining a first sector of said substrate carrying said circuit and configured to be separated from the IC card, said first sector having a form and size based upon a Nano-SIM (4FF) IC card format, said first area having a first line delimiting said first sector to the 4FF IC card format, and a second area defining a second sector around said first sector and configured to be separated from the IC card based upon a second line, said second sector having a form and size based upon at least one of a Mini-SIM (2FF) IC card format and a Micro-SIM (3FF) IC card format; and a coating on the second surface of said substrate and being aligned with said second area, said coating having, along said second sector, a thickness equal to a difference between a thickness of said at least one of the 2FF IC card format and the 3FF IC card format and a thickness of said first sector.

2. The IC card according to claim 1 wherein said coating comprises a screen printed coating.

3. The IC card according to claim 1 wherein each the first and second lines comprises a weakening/pre-cut line.

4. The IC card according to claim 1 wherein the thickness of said first sector is equal to a thickness of the substrate and a thickness of the 4FF IC card format.

5. The IC card according to claim 1 wherein a thickness of the substrate is less than a thickness of the 4FF IC card format; and wherein the coating also covers the first surface of the substrate along said first sector, with a thickness equal to a difference between the thickness of the 4FF IC card format and the thickness of the substrate, thereby providing said first sector with an effective thickness equal to the thickness of the 4FF IC card format.

6. The IC card according to claim 1 wherein said substrate comprises a third area defining a third sector around said second sector, said second sector having a form and size based upon the 3FF IC card format, said third sector having a form and size based upon the 2FF IC card format, said third sector being configured to be separated from the IC card based upon a third line and said coating being applied along said second sector and said third sector.

7. The IC card according to claim 6 wherein the third line passes through an entirety of said substrate and said coating.

8. The IC card according to claim 1 wherein said substrate has a form and size based upon a full-size (1FF) IC card format.

9. The IC card according to claim 1 wherein said coating is over an entirety of the second surface of the substrate with exception of a portion along the first sector.

10. The IC card according to claim 1 wherein at least one of the first line and the second line is formed only in said substrate.

11. The IC card according to claim 1 wherein at least one of the first line and the second line is formed only in a set thickness of said substrate.

12. The IC card according to claim 1 wherein at least one of the first line and the second line is formed in both a set thickness of said substrate and a set thickness of said coating.

13. The IC card according to claim 1 wherein the second line extends into said substrate to a depth greater than the first line.

14. An integrated circuit (IC) card comprising:
a substrate having opposing first and second surfaces;
a circuit carried by said substrate adjacent the first surface of said substrate;
said substrate comprising
a first area defining a first sector of said substrate carrying said circuit and configured to be separated from the IC card, said first sector having a form and size based upon a first IC card format, said first area having a first line delimiting said first sector to the first IC card format, and a second area defining a second sector around said first sector and configured to be separated from the IC card based upon a second line, said second sector having a form and size based upon at least one of a second IC card format and a third IC card format; and a coating on the second surface of said substrate and being aligned with said second area, said coating having, along said second sector, a thickness equal to a difference between a thickness of said at least one of the second IC card format and the third IC card format and a thickness of said first sector.

15. The IC card according to claim 14 wherein each the first and second lines comprises a weakening/pre-cut line.

16. The IC card according to claim 14 wherein the thickness of said first sector is equal to a thickness of the substrate and a thickness of the first IC card format.

17. The IC card according to claim 14 wherein a thickness of the substrate is less than a thickness of the first IC card format; and wherein the coating also covers the first surface of the substrate along said first sector, with a thickness equal to a difference between the thickness of the first IC card format and the thickness of the substrate, thereby providing said first sector with an effective thickness equal to the thickness of the first IC card format.

18. The IC card according to claim 14 wherein said substrate comprises a third area defining a third sector around said second sector, said second sector having a form and size based upon the third IC card format, said third sector having a form and size based upon the second IC card format, said third sector being configured to be separated from the IC card based upon a third line and said coating being applied along said second sector and said third sector.

19. The IC card according to claim 14 wherein said substrate has a form and size based upon a full-size (1FF) IC card format.

20. A method of making an integrated circuit (IC) card comprising:
positioning a circuit in a substrate with a plurality of bond pads of the circuit being aligned with a first surface of the substrate;
forming in the substrate a first area defining a first sector having a form and size based upon a Nano-SIM (4FF) IC card format, and a second area being around the first sector and defining a second sector, the second sector having a form and size based upon at least one of a Mini-SIM (2FF) IC card format and a Micro-SIM (3FF) IC card format, the first and second sectors being able to be separated from the IC card;
forming a coating on a second surface of the substrate opposite to the first surface, the coating being aligned with the second sector and having a thickness equal to a difference between a thickness of the at least one of the 2FF IC card format and the 3FF IC card format and a thickness of the first sector;
forming a first line in the substrate for delimiting the first sector to the 4FF IC card format of the substrate and for permitting separation of the first sector from the IC card; and
forming a second line in the substrate for delimiting the second sector card to the at least one of the 2FF IC card format and the 3FF IC card format and for permitting separation of the second sector from the IC card.

21. The method according to claim 20 wherein the forming of the coating comprises a screen printing process.

22. The method according to claim 20 further comprising forming a third line in the substrate for delimiting a third sector around the second sector to a form and size based upon a Mini-SIM (2FF) IC card format.

23. The method according to claim 20 wherein each the first and second lines comprises a weakening/pre-cut line.

24. A method for making an integrated circuit (IC) card comprising:
   forming a substrate having opposing first and second surfaces;
   positioning a circuit carried by the substrate adjacent the first surface of the substrate;
   the substrate comprising
      a first area defining a first sector of the substrate carrying the circuit and configured to be separated from the IC card, the first sector having a form and size based upon a first IC card format, the first area having a first line delimiting the first sector to the first IC card format, and
      a second area defining a second sector around the first sector and configured to be separated from the IC card based upon a second line, the second sector having a form and size based upon at least one of a second IC card format and a third IC card format; and
   forming a coating on the second surface of the substrate and being aligned with the second area, the coating having, along the second sector, a thickness equal to a difference between a thickness of the at least one of the second IC card format and the third IC card format and a thickness of the first sector.

25. The method according to claim 24 wherein forming of the coating comprises a screen printing process.

26. The method according to claim 24 wherein each the first and second lines comprises a weakening/pre-cut line.

27. The method according to claim 24 wherein the thickness of the first sector is equal to a thickness of the substrate and a thickness of the first IC card format.

28. The method according to claim 24 wherein a thickness of the substrate is less than a thickness of the first IC card format; and wherein the coating also covers the first surface of the substrate along the first sector, with a thickness equal to a difference between the thickness of the first IC card format and the thickness of the substrate, thereby providing the first sector with an effective thickness equal to the thickness of the first IC card format.

* * * * *